United States Patent
Singh et al.

(10) Patent No.: US 6,194,313 B1
(45) Date of Patent: *Feb. 27, 2001

(54) METHOD FOR REDUCING RECESS FOR THE FORMATION OF LOCAL INTERCONNECT AND OR PLUG TRENCH FILL FOR ETCHBACK PROCESS

(75) Inventors: Abha R. Singh, Garland; Girish Anant Dixit, Plano; Wei-Yung Hsu; Guoqiang Xing, both of Dallas, all of TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,971

(22) Filed: Apr. 15, 1998

Related U.S. Application Data

(60) Provisional application No. 60/044,295, filed on Apr. 30, 1997.

(51) Int. Cl.[7] ................................................. H01L 21/44
(52) U.S. Cl. ............................ 438/675; 438/692; 438/697
(58) Field of Search ........................... 257/752, 758, 257/759, 632; 438/361, 623, 629, 669, 675, 692, 700, 697, 685, 687

(56) References Cited

U.S. PATENT DOCUMENTS

| | | | |
|---|---|---|---|
| 4,833,519 | * | 5/1989 | Kawano et al. . |
| 5,100,501 | * | 3/1992 | Blumenthal et al. . |
| 5,757,077 | * | 5/1998 | Chung et al. . |
| 5,763,324 | * | 6/1998 | Nogami . |
| 5,763,954 | * | 6/1998 | Hyajutake . |
| 5,783,490 | * | 7/1998 | Tseng . |
| 5,892,273 | * | 4/1999 | Iwasaki et al. . |
| 5,892,277 | * | 4/1999 | Ikemizu et al. . |
| 5,982,040 | * | 11/1999 | Yamada et al. . |
| 6,001,739 | * | 12/1999 | Konishi . |
| 6,063,707 | * | 5/2000 | Atwater et al. . |
| 6,077,770 | * | 6/2000 | Hsu . |
| 6,080,674 | * | 6/2000 | Wu et al. . |

* cited by examiner

*Primary Examiner*—Sheila V. Clark
(74) *Attorney, Agent, or Firm*—Jacqueline J. Garner; Wade James Brady, III; Frederick J. Telecky, Jr.

(57) ABSTRACT

A method to reduce the effective recess in conductive plugs 220 by performing an oxide etch or oxide CMP, selective to the conductive material in question. This method can be used for any conductive plug 220 (e.g. aluminum, tungsten, copper, titanium nitride, etc.). In addition, this method is also applicable in contact, via, and trench (damascene) applications. Furthermore, this process can advantageously be used in logic, SRAM, and DRAM applications.

14 Claims, 4 Drawing Sheets

METHOD FOR REDUCING RECESS FOR THE FORMATION OF LOCAL INTERCONNECT AND OR PLUG TRENCH FILL FOR ETCHBACK PROCESS

This application claims priority under 35 USC §119 (e) (1) of provisional application No. 60/044,295, filed Apr. 30, 1997.

BACKGROUND AND SUMMARY OF THE INVENTION

The present invention relates to integrated circuit structures and fabrication methods.

Background: Metal Plugs

In modern integrated circuit fabrication, it is increasingly necessary to fill vias and contact holes which have a high "aspect ratio". This means a ratio of height to width which is 2:1 or more, and, as technology progresses, may be as high as 10:1 or more in future generations. Completely filling such holes with metal at an acceptably low temperature is very difficult, particularly for metals (such as aluminum) which do not have a good low-temperature chemical vapor deposition (CVD) process.

One concern with aluminum metallization is electromigration: a pure aluminum line may gradually thin out, in service, in locations of high current density. However, the addition of copper greatly reduces this tendency. Longer electromigration (EM) lifetimes improve the product reliability. Thus, typical aluminum alloys use silicon (typically one-half to one percent atomic) or copper (typically one-half to one percent atomic) or both as alloying agents. Efforts have been made to find other satisfactory aluminum alloy compositions; see e.g. Kikuta and Kikkawa, "Electromigration characteristics for Al—Ge—Cu," 143 J. Electrochem. Soc. 1088 (1996), which is hereby incorporated by reference.

In a typical plug process, as shown in prior art FIG. 3A, a contact or via hole 302 is etched through a dielectric layer 310 to expose an underlying layer 300, followed by the filling of the cavities 302 with a metal layer (e.g. tungsten, aluminum, or copper) and the etchback of the metal layer to remove it from on top of the dielectric 310 to leave metal plugs 320.

The etchback process for the metal plug fill can cause an appreciable amount of plug recess 325, as can be seen in FIG. 3A. This can create problems after the subsequent deposition of the metal film stack 330 (e.g. two titanium nitride layers separated by a layer of aluminum) over the via/contact plugs 320. For example, the following problems can occur when forming overlying via structures: via etch stopping, shown in prior art FIG. 3B, which is due to an excessive amount of HSQ (Hydrogen Silsesquioxane) 360 (or any carbon or fluorine containing organic polymer) in the vias 370 as a result of non-planarity arising from the plug recess 325; and via poisoning, shown in prior art FIG. 3C, which is due to the outgassing of SOG (spin-on glass) 360 during deposition of aluminum 380 resulting in poor step coverage of the aluminum 380.

Background: Planarization

One conventional approach to the problem of plug recess includes performing a chemical-mechanical polishing process on the metal plugs after deposition. Chemical-mechanical polishing (CMP) is a planarization technique which has become increasingly important in integrated circuit processing in the 1990s. CMP, unlike most other planarization techniques, provides global planarization. This global planarization avoids problems of step coverage, and hence helps achieve the numerous multiple layers of metallization which are now desired. Global planarization also improves lithographic resolution, by removing constraints on the depth of field.

In a CMP process, a wafer is polished in a slurry of a very fine abrasive (typically alumina or silica). The slurry has a chemical composition which accelerates removal of the top surface. For example, for removal of tungsten, an acidic and oxidizing slurry is used. This helps to convert the surface of the tungsten into a tungsten oxide, which is easily removed by the mechanical polishing operation. For removal of dielectrics, a basic chemistry is more typically used, which is discussed in DeJule et al., "Advances in CMP," SEMCONDUCTOR INTERNATIONAL, p.88–96 (November 1996), which is hereby incorporated by reference. In order to produce a completely planar surface, one conventional approach uses a two-step CMP process, in which a short oxide CMP step follows a metal CMP step. This approach is described in U.S. Provisional patent application, Ser. No. 60/033,293, filed Dec. 10, 1996, which is hereby incorporated by reference.

Another conventional planarization technique involves using a photoresist to etchback the material. This process is carried out by first depositing the CVD film that will serve as the interlevel dielectric. This layer is then coated with a photoresist film that will later be etched off non-selectively. Planarization of the dielectric surface occurs by controlling the difference in plasma etch rates between the photoresist and the dielectric. However, this planarization process is completely non-selective and can result in overetching of the dielectric.

Methods for Reducing the Recess

The present application discloses structures and methods to reduce the effective recess in metal plugs by performing either a dielectric etch step, selective to the metal in question, after a metal CMP, or a dielectric etch or CMP step after a metal etch. The disclosed methods can be used for any metal plug (e.g. Aluminum, tungsten, copper etc.). In addition, this method is also applicable in contact, via, and trench applications. Furthermore, this process can advantageously be used in logic, SRAM, and DRAM applications. The recess height can even be made negative (so that the plug protrudes above the dielectric), which has further advantages.

Advantages of the disclosed methods and structures include:
lower cost;
manufacturable;
no need for new hardware development;
reduced recess;
reduced chance of via etch stop;
less chance of via poisoning; and
reduced dielectric roughness.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Process Overview

Figure 1:
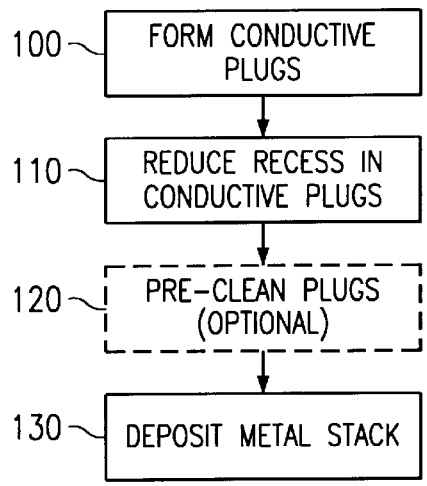
FIG. 1 is a process flow for forming conductive plugs in accordance with preferred embodiments of the present invention.
Figure 2A:
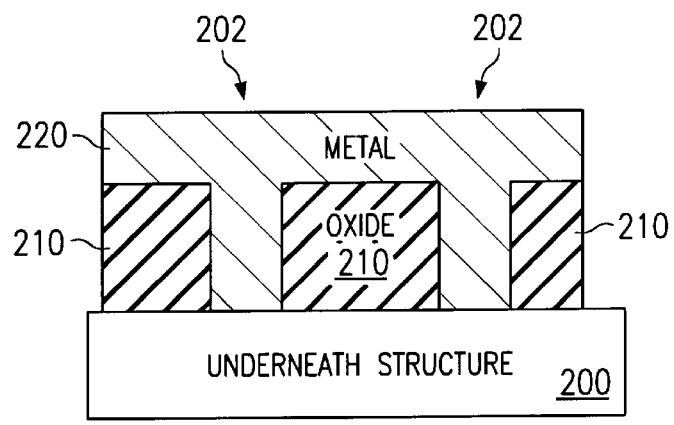
FIGS. 2A–2C schematically illustrate the etchback of conductive plugs with a reduced recess.
Figure 2B:
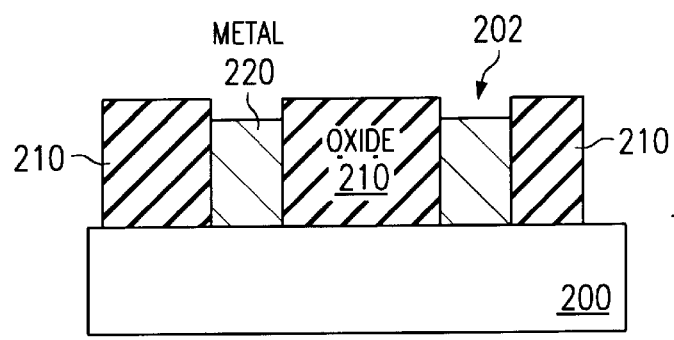
Figure 2C:
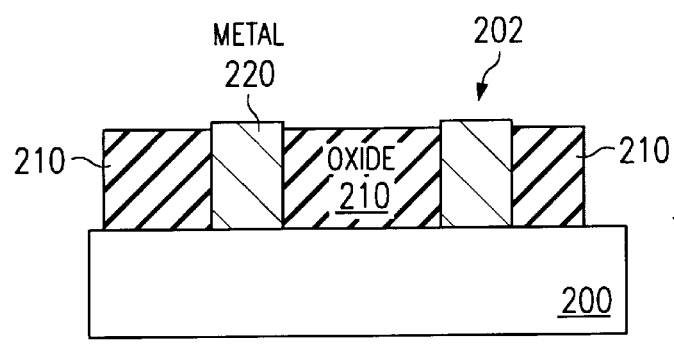
Figure 3A:
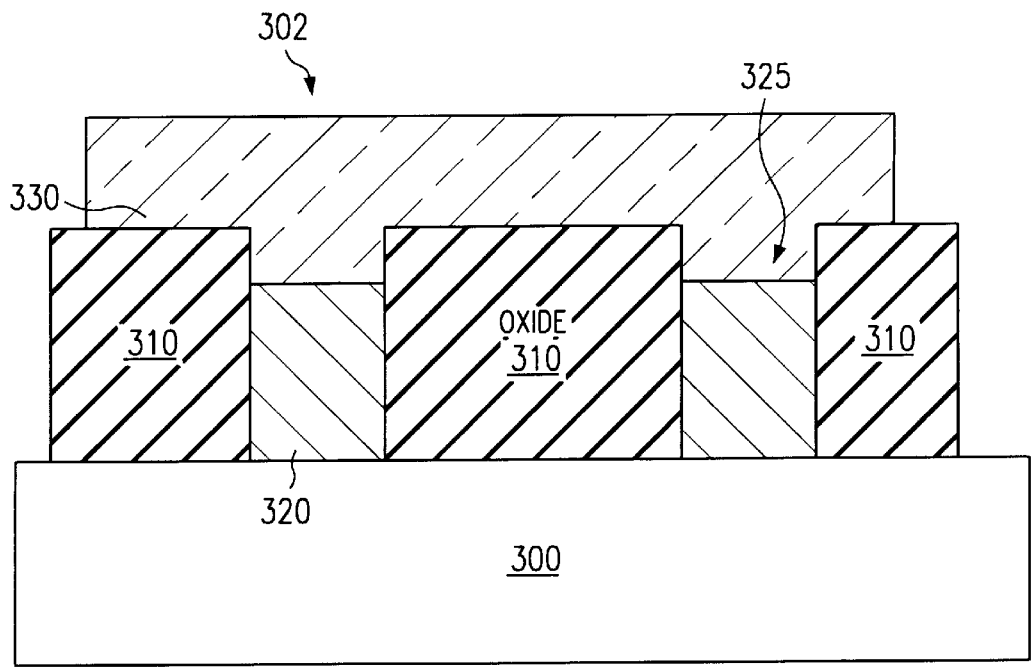
FIGS. 3A–3C are cross-sectional diagrams of prior art metal plugs having an appreciable amount of plug recess.
Figure 3B:
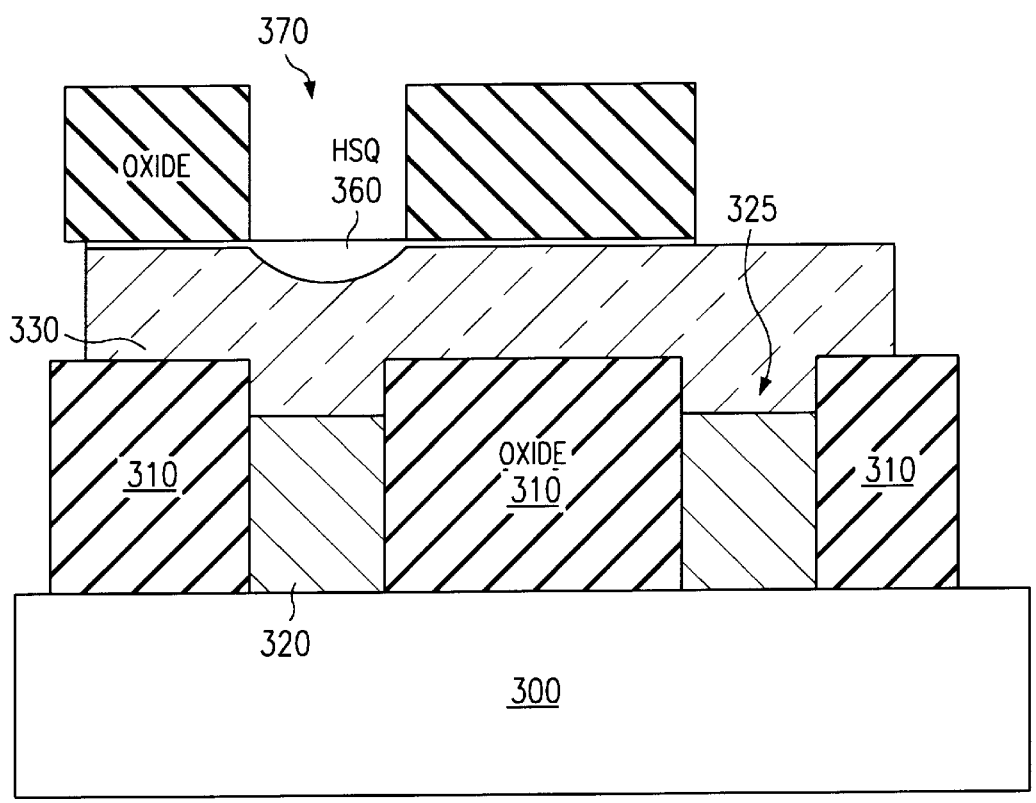
Figure 3C:
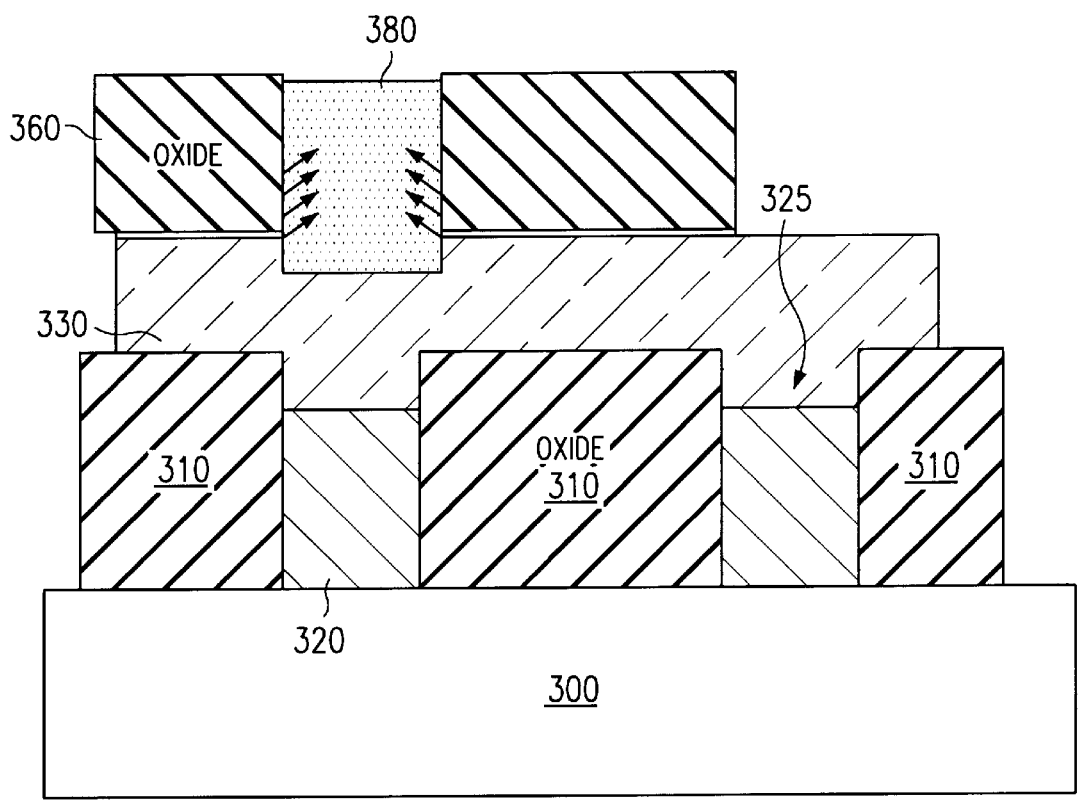
Figure 5:
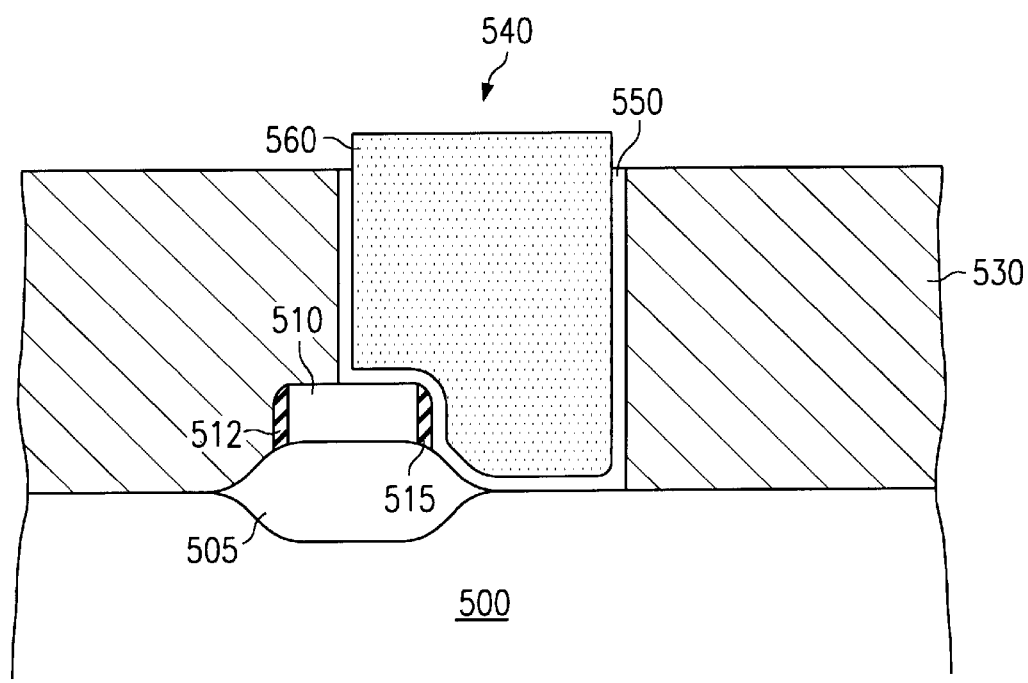
FIGS. 4 and 5 show a sample contact stricture formed using preferred embodiments of the present invention.

FIG. 1 shows a process flow for fabricating conductive plugs with a reduced recess, and FIGS. 2A–2C schematically illustrate the formation of conductive plugs in accordance with preferred embodiments of the present invention.

As shown in FIG. 2A, a cavity 202 has been etched through a dielectric layer 210, such as a stack of TEOS-derived SiO2 over HSQ (or a low-k dielectric) over TEOS, to expose an underlying layer 200, followed by the filling of the cavities 202 with a conductive layer 220. Subsequently, the conductive layer 220 is etched back (or chemically mechanically polished) on top of the dielectric 210 to form conductive plugs 220 (step 100), shown in FIG. 2B. Typically, a thin barrier layer (e.g. TiN) is deposited on the surface of the dielectric layer and within the cavities prior to the deposition of the conductive material. Therefore, the etchback of the conductive material can be controlled by stopping on either the barrier layer or the dielectric layer.

The etchback process can create a recessed conductive plug, which is illustrated in FIG. 2B. To reduce the effective size of the recess, a dielectric etch or dielectric CMP (step 110) can then be performed, selective to the conductive plugs, as shown in FIG. 2C. The dielectric etch and CMP processes advantageously reduce the dielectric roughness, and thus improve the texture of the dielectric.

Following the dielectric etch or CMP (step 110), a pre-clean step (optional step 120) of the conductive plug 220 can then optionally be preformed to eliminate native oxides and residue on the plugs 220. Finally, the metal film stack is blanket deposited (step 130) over the conductive plugs 220.

Sample Process Embodiment: Dielectric Etch after Metal Etch

In one embodiment, the dielectric material (e.g. TEOS/BPSG) is etched, selective to the conductive plugs, using for example a fluoro etch, after the conductive material (e.g. aluminum, or aluminum alloy which contains one percent copper or one percent silicon) is anisotropically etched (e.g. using a C12/BC13 etchant gas) to produce a more planar surface. A thin barrier layer of TiN typically lines the sides and bottom of the aluminum plug. Thereafter, the metal film stack (e.g. two TiN layers separated by a layer of aluminum) can be deposited over the aluminum plugs and the dielectric surface.

Alternative Process Embodiment: Dielectric Etch after Metal CMP

In another embodiment, the effective recess can be reduced by dry etching the dielectric material, selective to the conductive plugs, after performing a chemical mechanical polishing process on the conductive layer.

Alternative Process Embodiment: Dielectric CMP after Metal Etch

In another embodiment, the effective recess in conductive plugs can be reduced by performing a chemical mechanical polishing (CMP) process on the dielectric layer, selective to the conductive plugs, after the conductive layer is anisotropically etched (e.g. using a plasma etch). After the dielectric CMP, the surface of the dielectric will be co-planar with the surface of the conductive plug.

Alternative Process Embodiment: Non-Planar Surface

In alternative embodiments, after the dielectric etch, the surface of the conductive plug may protrude slightly above the surface of the dielectric (e.g. by at least ten percent of the width of the cavity), as shown in FIG. 2C.

Alternative Process Embodiment: Aluminum Alloy with Copper Plugs

One example of a sample embodiment of the present invention includes the formation of copper plugs by either copper etchback or copper CMP followed by the etchback of the dielectric layer until the surface of the copper plugs is slightly higher than the surface of the dielectric. This structure, similar to the one shown in FIG. 2C, results in an increased amount of copper surface area contacting the subsequently deposited metal layer (e.g. an aluminum alloy), which advantageously increases the electromigration resistance.

Alternative Process Embodiment: Contact Structure

Figure 4:
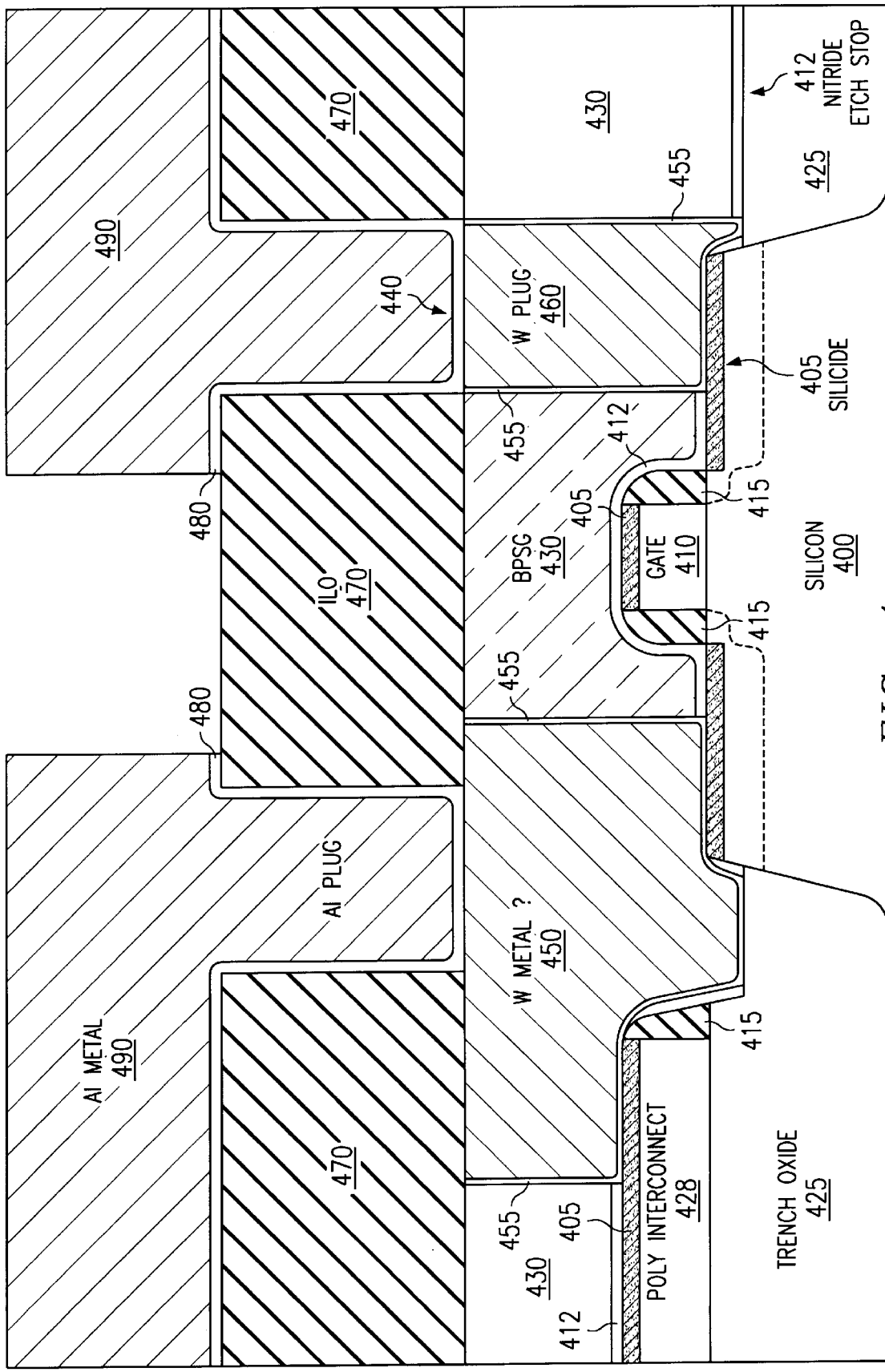

Another example of a sample embodiment of the present invention involves contact filing applications. As shown in FIG. 4, a contact hole 440 to a moat (e.g. active) region 400 next to a polysilicon gate 410 has been formed through a dielectric layer 430 (e.g. BPSG). The gate structure consists of the polysilicon gate 410 with sidewall spacers 415 and a capping layer 405 (e.g. metal silicide). The metal silicide 405 can be formed over all exposed areas of silicon prior to deposition of the dielectric 430. A nitride 412 overlies the gate structure and serves as an etch stop layer. The gate structure is isolated by trench oxide 425 on both sides. (In alternative embodiments, a LOCOS isolation can be used instead of the shallow trench isolation 425.) A polysilicon interconnect 428 with a silicide cap 405 and sidewall spacers 415 is shown over the trench oxide 425.

The adhesion and barrier layers 455 (e.g. titanium/TiN) can then be deposited on the sides and bottom of the contact hole 440, followed by the filling of the contact hole 440 with the contact material 460 (e.g. tungsten). In addition, the contact material can also be deposited within a local interconnect layer 450 (referred to as "Metal 0" layer), which is shown overlying the polysilicon interconnect 428.

After the etchback of the contact material 460 on top of the dielectric layer 430, the contact material 460 is typically recessed from the surface of the dielectric layer 430. Therefore, in order to reduce the effective recess of the contact material 460, an oxide dry etch or oxide CMP can be performed, in accordance with preferred embodiments of the present invention. As shown in FIG. 4, after the oxide dry etch or oxide CMP, the surface of the metal layer 450 and 460 (e.g. tungsten) is co-planar with the surface of the dielectric layer 430. Alternatively, the surface of the metal layer 450 and 460 can protrude slightly above the surface of the dielectric layer (e.g. by up to ten percent of the width of the contact hole).

Processing can then continue with the deposition, patterning, and etching of an additional dielectric layer 470, followed by the deposition of a barrier layer 480 (e.g. TiN)

and an additional metal layer 490 (e.g. aluminum). The barrier layer 480 avoids the interaction of aluminum 490 and tungsten 450 and 460. (If aluminum plugs are used instead of tungsten plugs, the barrier layer 455 would prevent spiking in the aluminum plug.)

Alternative Dielectric Etch Embodiment: Wet Etching

Alternatively, the effective recess of the metal plugs can be reduced by wet etching the dielectric material, selective to the metal plugs, using for example dilute hydrofluoric acid.

Alternative Conductor Embodiment: Tungsten

In another embodiment, the plugs can be formed from a layer consisting essentially of tungsten. However, barrier and adhesion layers need to be deposited prior to the tungsten deposition due to the poor adhesion properties of tungsten to dielectric materials.

Alternative Conductor Embodiment: Copper

In another embodiment, the plugs can be formed from a layer of copper. Typically, a liner layer is used when plugs are filled with copper to provide protection between the copper and the dielectric.

Alternative Conductor Embodiment: TiN

Alternatively, a layer of titanium nitride (TiN) can be deposited within openings in the dielectric and etched back or chemically mechanically polished to leave TiN plugs. This is advantageous in high aspect ratio applications, such as in the connection from an underlying transistor to an overlying capacitor in dynamic random access memory (DRAM) applications.

Alternative Barrier Layer Embodiment: TiAlN

In an alternative embodiment, a layer of TiAlN can be deposited prior to the metal layer to serve as a barrier or liner layer to enhance the texture and promote adhesion of the metal.

Alternative Barrier Layer Embodiment: TiSiN

In an alternative embodiment, a layer of TiSiN can be deposited prior to the metal layer to serve as a barrier or liner layer to enhance the texture and promote adhesion of the metal.

Alternative Barrier Layer Embodiment: WN

In an alternative embodiment, a layer of WN can be deposited prior to the metal layer to serve as a barrier or liner layer to enhance the texture and promote adhesion of the metal.

Alternative Barrier Layer Embodiment: TaN

In an alternative embodiment, a layer of TaN can be deposited prior to the metal layer to serve as a barrier or liner layer to enhance the texture and promote adhesion of the metal.

First Plug Deposition Process Embodiment: Extrusion Filling

The metal plug can be formed by a high pressure extrusion process, in which a metal layer (e.g. aluminum alloy) is deposited at temperatures no greater than 400 degrees C. to close the mouth of the cavity. Thereafter, the metal is forced into the cavity by high pressure argon or other gas (60–90 MPa).

Second Plus Deposition Process Embodiment: Reflow

In an alternative embodiment, the metal layer (e.g. aluminum alloy) is reflowed into the cavity by one step sputtering at elevated temperatures (e.g. greater than or equal to 350 degrees C. but preferably less than 450 degrees C.) and low power (to allow time for the aluminum to diffuse into the contacts and vias). Alternatively, a multi-step sputtering operation can be used, first at low temperature (e.g. less than 100 degrees C.), then at high temperature (e.g. greater than 400 degrees C.).

Third Plus Deposition Process Embodiment: CVD

Alternatively, the metal layer (e.g. aluminum, tungsten, or copper) can be deposited by chemical vapor deposition (CVD). However, tungsten CVD requires additional barrier and glue layers to be deposited prior to the CVD tungsten because of the poor adhesion of CVD tungsten to dielectric materials.

Alternative Metal Film Stack Embodiment: Ti/TiN/Al/TiN

Alternatively, a layer of titanium can be deposited prior to the bottom layer of TiN, followed by the deposition of the aluminum metal line and the encapsulating TiN layer.

According to a disclosed class of innovative embodiments, there is provided: An integrated circuit structure, comprising: a dielectric layer having openings therein, said openings being filled with a conductor; wherein the surface of said conductor protrudes above the surface of said dielectric layer by at least ten percent of the width of said openings.

According to another disclosed class of innovative embodiments, there is provided: A method of fabricating an integrated circuit structure, comprising the steps of: (a.) depositing a conductor layer on the surface of a dielectric layer and within openings in said dielectric layer; (b.) etching said conductor layer to remove said conductor layer from the surface of said dielectric layer, but not from within said openings, said step of etching forming a recessed conductor layer within said openings; and (c.) etching said dielectric layer selective to said conductor layer to reduce the effective depth of the recess of said recessed conductor layer.

According to another disclosed class of innovative embodiments, there is provided: A method of fabricating an integrated circuit structure, comprising the steps of: (a.) depositing a conductor layer over the surface of a dielectric layer and within openings in said dielectric layer; (b.) performing a polishing process on said conductor layer to remove said conductor layer from the surface of said dielectric layer, but not from within said openings, said step of etching forming a recessed conductor layer within said openings; and (c.) etching said dielectric layer selective to said conductor layer without polishing to reduce the effective depth of the recess of said recessed conductor layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

The methods disclosed herein are applicable to any process in which a cavity is formed in a dielectric material and subsequently filled with a metal or conductive nitride, including trench applications.

Of course, the specific etch chemistries, layer compositions, and layer thicknesses given are merely illustrative, and do not by any means delimit the scope of the claimed inventions.

The disclosed structures and methods can also be adapted to other combinations of dielectric materials in the interlevel dielectric. For example, phosphosilicates, germanosilicate, arsenosilicates or combinations thereof, can be used. In addition, fluorine-doped oxides (e.g. $SiO_xF_y$), thermal oxides and plasma oxides, as well as low-k dielectric materials, such as inorganic or organic dielectrics (e.g. xerogel or parylene), can be used.

What is claimed is:

1. A method of fabricating an integrated circuit structure which comprises the steps of:
   (a) providing a dielectric layer having an opening therein extending to a surface of said dielectric layer;
   (b) depositing an electrical conductor layer on said surface of said dielectric layer and within said opening in said dielectric layer;
   (c) removing said conductor layer from said surface of said dielectric layer and into said opening to provide a conductor layer recessed within said opening and beneath said surface; and
   (d) then etching said dielectric layer selective to said conductor layer to planarize said surface and the conductor layer; and
   (e) then forming metallization on and extending to said dielectric layer and said conductor layer.

2. A method of fabricating an integrated circuit structure which comprises the steps of:
   (a) providing a dielectric layer having an opening therein extending to a surface of said dielectric layer, said opening having a depth and a width;
   (b) depositing an electrical conductor layer on said surface of said dielectric layer and within said opening in said dielectric layer;
   (c) removing said conductor layer from said surface of said dielectric layer and from a portion of said opening adjacent said surface so that said conductor layer is recessed within said opening or coplanar with said surface; and
   (d) then etching said dielectric layer selective to said conductor layer to cause said conductor to protrude from said opening; and
   (e) then forming metallization on and extending to said dielectric layer and said conductor layer.

3. The method of claim 2 wherein said conductor layer protrudes from said opening by up to ten percent of the width of said opening.

4. A method of fabricating an integrated circuit structure which comprises the steps of:
   (a) providing a dielectric layer having an opening therein extending to a surface of said dielectric layer, said opening having a depth and a width;
   (b) depositing an electrical conductor layer on said surface of said dielectric layer and within said opening in said dielectric layer;
   (c) removing said conductor layer from said surface of said dielectric layer and into said opening to provide a conductor layer recessed within said opening and beneath said surface; and
   (d) then etching said dielectric layer selective to said conductor layer to a level such that said conductor layer protrudes beyond said surface; and
   (e) then forming metallization on and extending to said dielectric layer and said conductor layer.

5. The method of claim 4 wherein said conductor layer protrudes above said surface by up to ten percent of the width of said opening.

6. A method of fabricating an integrated circuit structure, comprising the steps of:
   (a) depositing a conductor layer on the surface of a dielectric layer and within openings in said dielectric layer;
   (b) performing a chemical-mechanical (CMP) polishing process on said conductor layer to remove said conductor layer from the surface of said dielectric layer, but not from within said openings, said step of polishing forming a recessed conductor layer within said openings; and
   (c) etching said dielectric layer selective to said conductor layer to reduce the effective depth of the recess of said recessed conductor layer.

7. The method of claim 6 further comprising the step of, before said step of depositing said conductor layer, depositing an adhesion layer over said dielectric layer and with said openings.

8. The method of claim 6 wherein said conductor layer consists essentially of tungsten.

9. The method of claim 6 wherein said conductor layer consists essentially of aluminum.

10. The method of claim 6 wherein said conductor layer consists essentially of copper.

11. The method of claim 6 wherein said step (c) reduces the effective depth of the recess until the surface of said dielectric layer is complanar with the surface of said conductor layer.

12. The method of claim 6 wherein said step (c) reduces the effective depth of the recess until the surface of said dielectric layer is above the surface of said conductor layer by less than ten percent of the width of said openings.

13. The method of claim 6 wherein step (c) reduces the effective depth of the recess until the surface of said conductor layer protrudes above the surface of said dielectric layer by at least ten percent of the width of said openings.

14. The method of claim 6 further comprising the step of depositing an additional conductor layer over said dielectric layer and said conductor layer.

* * * * *